(12) United States Patent
Terada et al.

(10) Patent No.: US 6,172,557 B1
(45) Date of Patent: Jan. 9, 2001

(54) TIME COUNTING CIRCUIT, PULSE CONVERTING CIRCUIT AND FM DEMODULATING CIRCUIT

(75) Inventors: Yutaka Terada, Osaka; Keiichi Kusumoto, Hyogo; Akira Matsuzawa, Kyoto, all of (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/398,817

(22) Filed: Sep. 20, 1999

Related U.S. Application Data (62) Division of application No. 08/747,180, filed on Nov. 12, 1996, now Pat. No. 5,982,841.

(30) Foreign Application Priority Data

Nov. 13, 1995 (JP) .................................................. 7-293894

(51) Int. Cl.⁷ ............................. H03D 3/00; H03B 19/00; H03K 21/00
(52) U.S. Cl. ........................ 329/341; 329/343; 327/115; 327/117
(58) Field of Search ........................... 329/300–303, 329/341–343; 327/115, 117, 118; 377/20

(56) References Cited

U.S. PATENT DOCUMENTS

| | | | |
|---|---|---|---|
| 4,712,072 | 12/1987 | Kawanabe | 377/20 |
| 4,953,095 | 8/1990 | Ishikawa et al. | 377/20 |
| 5,027,298 | 6/1991 | Khazam | 377/20 |
| 5,270,666 | 12/1993 | Rapeli et al. | 329/341 |
| 5,438,599 | 8/1995 | Lincoln | 377/20 |
| 5,440,592 | 8/1995 | Ellis et al. | 375/354 |
| 5,689,539 | 11/1997 | Murakami | 377/20 |
| 5,724,399 | 3/1998 | Imakura | 377/20 |
| 5,812,626 | 9/1998 | Kusumoto et al. | 327/20 |
| 5,828,717 | 10/1998 | Kusumoto et al. | 377/24 |
| 5,835,552 | 11/1998 | Kusumoto et al. | 377/24 |
| 5,982,841 * | 11/1999 | Terada et al. | 377/20 |

FOREIGN PATENT DOCUMENTS

| | | |
|---|---|---|
| 44 00 825 | 7/1994 | (DE) . |
| 0 735 374 | 10/1996 | (EP) . |
| 58-169222 | 10/1983 | (JP) . |

OTHER PUBLICATIONS

T. Wtanabe et al., "A Time–to–Digital Converter LSI", Technical Report of IEICE, pp. 37–43.

* cited by examiner

*Primary Examiner*—David Mis
(74) *Attorney, Agent, or Firm*—McDermott, Will & Emery (57) ABSTRACT

Provided is a time counting circuit which can measure the time taken from the rising edge to the falling edge of a pulse signal and the time from the falling edge to the rising edge thereof. The time counting circuit according to the present invention comprises a measuring circuit for measuring the time between either of the rising and falling edges of the pulse signal, and a pulse converting circuit for converting a pulse signal to be measured to a pulse signal having either of the edges in accordance with the rising edge of the pulse signal to be measured and having either of the edges in accordance with the falling edge of the pulse signal to be measured. The time between either of the edges of the pulse signal converted by the pulse converting circuit is measured by the measuring circuit. The time obtained by measurement is the time taken from the rising edge to the falling edge of the pulse signal to be measured or the time taken from the falling edge to the rising edge thereof.

4 Claims, 10 Drawing Sheets

| TIME | OUTPUT OF INVERIER RING | SIGNAL PROCESSING CIRCUIT OUTPUT |
|---|---|---|
| 0 | 0 1 0 1 0 ... 0 1 0 1 0 | 0 0 0 0 0 0 |
| 1 | 1 1 0 1 0 ... 0 1 0 1 0 | 0 0 0 0 0 1 |
| 2 | 1 0 0 1 0 ... 0 1 0 1 0 | 0 0 0 0 1 0 |
| 3 | 1 0 1 1 0 ... 0 1 0 1 0 | 0 0 0 0 1 1 |
| 4 | 1 0 1 0 0 ... 0 1 0 1 0 | 0 0 0 1 0 0 |
| ⋮ | ⋮ | ⋮ |
| 29 | 1 0 1 0 1 ... 1 1 0 1 0 | 0 1 1 1 0 1 |
| 30 | 1 0 1 0 1 ... 1 0 0 1 0 | 0 1 1 1 1 0 |
| 31 | 1 0 1 0 1 ... 1 0 1 1 0 | 0 1 1 1 1 1 |
| 32 | 1 0 1 0 1 ... 1 0 1 0 0 | 1 0 0 0 0 0 |
| 33 | 1 0 1 0 1 ... 1 0 1 0 1 | 0 0 0 0 0 0 |
| 34 | 0 0 1 0 1 ... 1 0 1 0 1 | 0 0 0 0 0 1 |
| 35 | 0 1 1 0 1 ... 1 0 1 0 1 | 0 0 0 0 1 0 |
| 36 | 0 1 0 0 1 ... 1 0 1 0 1 | 0 0 0 0 1 1 |
| 37 | 0 1 0 1 1 ... 1 0 1 0 1 | 0 0 0 1 0 0 |
| 38 | 0 1 0 1 0 ... 1 0 1 0 1 | 0 0 0 1 0 1 |
| ⋮ | ⋮ | ⋮ |
| 62 | 0 1 0 1 0 ... 0 0 1 0 1 | 0 1 1 1 0 1 |
| 63 | 0 1 0 1 0 ... 0 1 1 0 1 | 0 1 1 1 1 0 |
| 64 | 0 1 0 1 0 ... 0 1 0 0 1 | 0 1 1 1 1 1 |
| 65 | 0 1 0 1 0 ... 0 1 0 1 1 | 1 0 0 0 0 0 |
| 66 | 0 1 0 1 0 ... 0 1 0 1 0 | 0 0 0 0 0 0 |

Fig. 4

| TIME | INVERTER | COUNTER OUTPUT (UPPER BIT) | SIGNAL PROCESSING CIRCUIT OUTPUT (LOWER BIT) | ADD VALUE | TIME DATA |
|---|---|---|---|---|---|
| 0 | 1 | 000000 | 0, 00000 | 000000 | 0, 000000, 00000 |
| 1 | 2 | ↓ | 0, 00001 | ↓ | 0, 000000, 00001 |
| 2 | 3 |  | 0, 00010 |  | 0, 000000, 00010 |
| ⋮ | ⋮ |  | ⋮ |  | ⋮ |
| 30 | 31 |  | 0, 11110 |  | 0, 000000, 11110 |
| 31 | 32 |  | 0, 11111 |  | 0, 000000, 11111 |
| 32 | 33 |  | 1, 00000 |  | 0, 000001, 00000 |
| 33 | 1 | 000001 | 0, 00000 | 000001 | 0, 000001, 00001 |
| 34 | 2 | ↓ | 0, 00001 | ↓ | 0, 000001, 00010 |
| 35 | 3 |  | 0, 00010 |  | 0, 000001, 00011 |
| ⋮ | ⋮ |  | ⋮ |  | ⋮ |
| 63 | 31 |  | 0, 11110 |  | 0, 000001, 11111 |
| 64 | 32 |  | 0, 11111 |  | 0, 000010, 00000 |
| 65 | 33 |  | 1, 00000 |  | 0, 000010, 00001 |
| 66 | 1 | 000010 | 0, 00000 | 000010 | 0, 000010, 00010 |
| 67 | 2 | ↓ | 0, 00001 | ↓ | 0, 000010, 00011 |
| 68 | 3 |  | 0, 00010 |  | 0, 000010, 00100 |
| ⋮ | ⋮ |  | ⋮ |  | ⋮ |
| 96 | 31 |  | 0, 11110 |  | 0, 000011, 00000 |
| 97 | 32 |  | 0, 11111 |  | 0, 000010, 00001 |
| 98 | 33 |  | 1, 00000 |  | 0, 000010, 00010 |
| ⋮ | ⋮ |  | ⋮ |  | ⋮ |
| 1023 | 1 | 011111 | 0, 00000 | 011111 | 0, 011111, 11111 |
| 1024 | 2 | ↓ | 0, 00001 | ↓ | 0, 100000, 00000 |
| ⋮ | ⋮ |  | ⋮ |  | ⋮ |
| 1053 | 31 |  | 0, 11110 |  | 0, 100000, 11101 |
| 1054 | 32 |  | 0, 11111 |  | 0, 100000, 11110 |
| 1055 | 33 |  | 1, 00000 |  | 0, 100000, 11111 |
| 1056 | 1 | 100000 | 0, 00000 | 100000 | 0, 100001, 00000 |
| 1057 | 2 | ↓ | 0, 00001 | ↓ | 0, 100001, 00001 |
| ⋮ | ⋮ |  | ⋮ |  | ⋮ |
| 1086 | 31 |  | 0, 11110 |  | 0, 100001, 11110 |
| 1087 | 32 |  | 0, 11111 |  | 0, 100001, 11111 |
| 1088 | 33 |  | 1, 00000 |  | 0, 100010, 00000 |
| ⋮ | ⋮ |  | ⋮ |  | ⋮ |
| 2046 | 1 | 111110 | 0, 00000 | 111110 | 0, 111111, 11110 |
| 2047 | 2 | ↓ | 0, 00001 | ↓ | 0, 111111, 11111 |
| ⋮ | ⋮ |  | ⋮ |  | ⋮ |
| 2076 | 31 |  | 0, 11110 |  | 1, 000000, 11100 |
| 2077 | 32 |  | 0, 11111 |  | 1, 000000, 11101 |
| 2078 | 33 |  | 1, 00000 |  | 1, 000000, 11110 |
| 2079 | 1 | 111111 | 0, 00000 | 111111 | 1, 000000, 11111 |
| 2080 | 2 | ↓ | 0, 00001 | ↓ | 1, 000001, 00000 |
| ⋮ | ⋮ |  | ⋮ |  | ⋮ |
| 2109 | 31 |  | 0, 11110 |  | 1, 000001, 11101 |
| 2110 | 32 |  | 0, 11111 |  | 1, 000001, 11110 |
| 2111 | 33 |  | 1, 00000 |  | 1, 000001, 11111 |

TIME COUNTING CIRCUIT, PULSE CONVERTING CIRCUIT AND FM DEMODULATING CIRCUIT

This is a divisional of application Ser. No. 08/747,180, filed Nov. 12, 1996 now U.S. Pat. No. 5,982,841.

BACKGROUND OF THE INVENTION

The present invention relates to time counting circuits for measuring such time as the pulse spacing of a pulse signal, pulse converting circuits, and FM demodulating circuits for demodulating FM signals whose frequencies are modulated.

It has been expected that time counting circuits for measuring such time as the pulse spacing of a pulse signal are utilized in the field of digital communication and the like. In recent years, it has become possible to mount a time counting circuit composed of a CMOS transistor in conjunction with other digital circuits on a single chip, which has accomplished a significant reduction in the cost of manufacturing semiconductor devices including the time counting circuits.

A time counting circuit which exhibits further stabilized operation with higher accuracy may also find extensive application in various fields including the demodulation of FM signals and the demodulation of bus signals in an LSI. If a time counting circuit capable of measuring an extremely short time with accuracy and stability can be utilized for the demodulation of FM signals, the cost of a semiconductor device can be reduced significantly.

Figure 10:
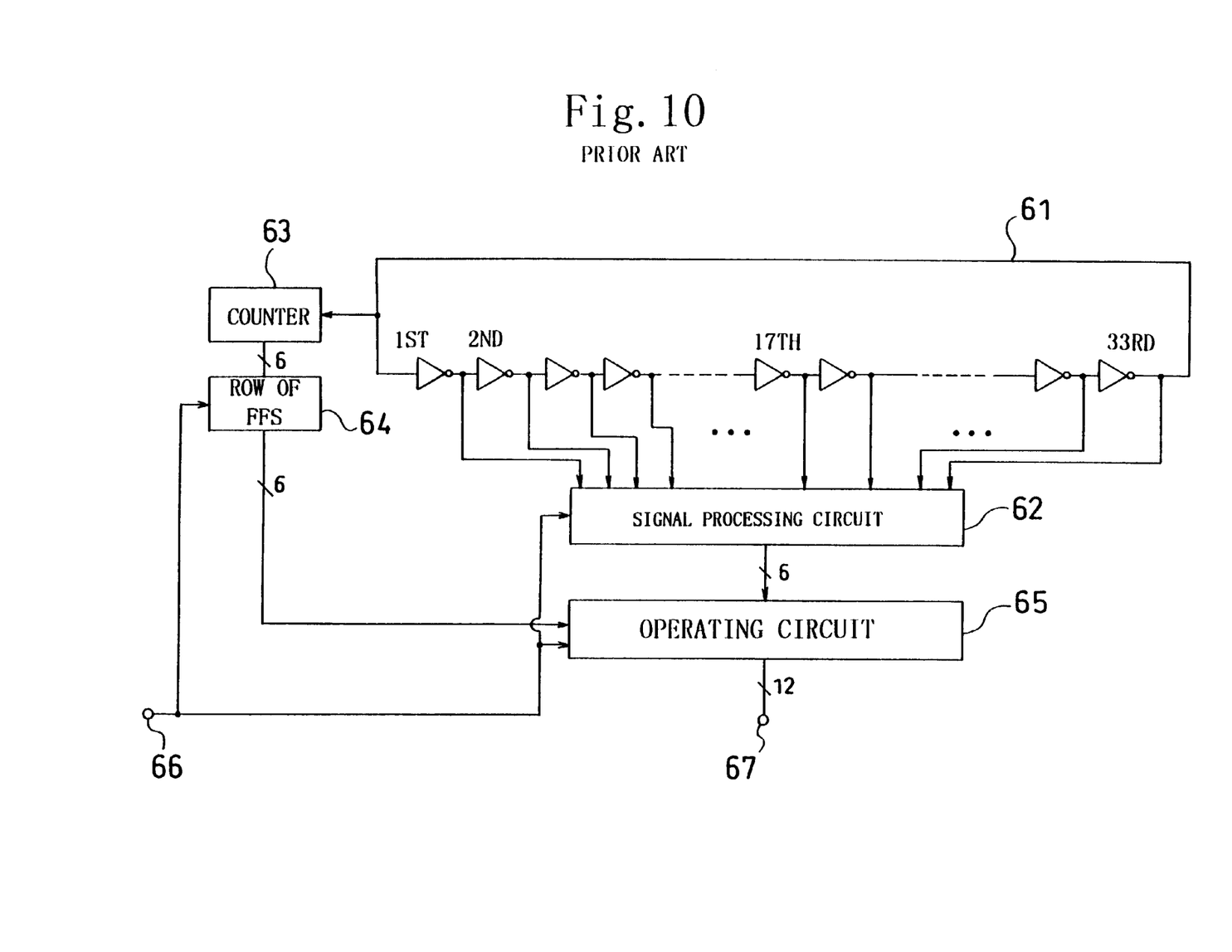
FIG. 10 is a block diagram showing the structure of a time counting circuit according to the prior art.

FIG. 10 is a block diagram showing an example of the structure of a conventional time counting circuit. The time counting circuit shown in FIG. 10 obtains time data which represents the pulse spacing of pulse signals to be measured which are inputted to an input terminal 66, and outputs the same time data from an output terminal 67 (see "Time/Numeric Value Converter LSI" Technical Report of IEICE, ICD93-77 (1993-08)).

In FIG. 10, the reference numeral 61 designates an inverter ring in which 33 inverters are connected in a ring. Since an odd number of inverters are connected in a ring, the inverter ring 61 oscillates so that the signal transition from the HIGH level to the LOW level or from the LOW level to the HIGH level circulates on the inverter ring 61 in a constant period. The reference numeral 62 designates a signal processing circuit which inputs the output signal of each inverter composing the inverter ring 61 and generates numeric data in accordance with the current position of the signal transition. The reference numeral 63 designates a counter which counts the change of the output signal of the 33rd inverter. The count data indicates the circulation number of the signal transition in the inverter ring 61. The reference numeral 64 designates a row of FFs (flip-flops) which holds and outputs the count data outputted from the counter 63 when a pulse signal to be measured which is inputted from the input terminal 66 rises. The signal processing circuit 62 also outputs the generated numeric data when the pulse signal to be measured rises. The reference numeral 65 designates an operating circuit which outputs time data indicative of the pulse spacing of the pulse signal to be measured from the output terminal 67 based on the numeric data outputted from the signal processing circuit 62 and the count data outputted from the row of FFs 64.

However, the conventional time counting circuit has the following problems.

In the conventional time counting circuit, the signal processing circuit 62 outputs the numeric data with the rising timing of the pulse signal to be measured, and the row of FFs 64 also outputs the count data of the counter 63 with the rising timing of the pulse signal to be measured. For this reason, the time data outputted from the output terminal 67 represents the time taken from the rise of the pulse signal to be measured to the next rise thereof.

For example, it is supposed that an FM signal is demodulated by the conventional time counting circuit. The FM signal oscillates with a constant amplitude and its frequency changes with time. A frequency for each time is information. In this case, the FM signal is first converted to an FM pulse signal. The FM pulse signal is obtained by amplifying the FM signal to a source voltage and a ground voltage with a reference voltage as a center. The time taken from the rise of the FM pulse signal to the next rise thereof (which is a period of the FM signal) is obtained by the time counting circuit. The frequency of the FM signal for each time can be obtained by getting the inverse number of the period.

However, the frequency of the FM signal also changes in one period. For this reason, there is a possibility that sufficient demodulation accuracy cannot be obtained by demodulation on such a period basis. For example, in the case where a voice is converted to the FM signal to be transmitted and demodulated by the conventional time counting circuit, the distortion of the signal waveform is caused so that the reproduction accuracy of the FM signal is deteriorated. Consequently, it is apparent that the original voice which is clear cannot be reproduced.

If the time taken from the rise to the fall of the FM pulse signal and the time taken from the fall to the rise thereof can be measured, the reproduction accuracy of the FM signal can be enhanced so that a clear voice can be reproduced. However, the conventional time counting circuit has a problem that the time taken from the rise to the fall of the pulse signal or the time taken from the fall to the rise thereof cannot be measured.

While there are some methods for improving the conventional time counting circuit so as to pick up the rising and falling edges of the pulse signal to be measured together, it is very difficult to cause the time to pick up the rising edge to coincide with the time to pick up the falling edge.

SUMMARY OF THE INVENTION

In consideration of the foregoing, it is an object of the present invention to provide a time counting circuit which can measure, with high accuracy, the time taken from the rising edge to the falling edge of a pulse signal to be measured and the time taken from the falling edge to the rising edge thereof.

The present invention provides a time counting circuit having the function of measuring the time between either of rising and falling edges of a pulse signal, comprising a pulse converting circuit for converting a pulse signal to be measured to a pulse signal having either of the edges in accordance with the rising edge of the pulse signal to be measured and having either of the edges in accordance with the falling edge of the pulse signal to be measured.

According to the time counting circuit of the present invention, the time taken from the rising edge to the falling edge of the pulse signal to be measured or the time taken from the falling edge to the rising edge thereof can be measured with high accuracy by measuring the time between either of edges of the pulse signal converted by the pulse converting circuit.

It is preferable that the pulse converting circuit should comprise a signal generating circuit for generating a clock signal, a counter for counting the clock signal outputted from the signal generating circuit, and a synchronous circuit for receiving the pulse signal to be measured, causing an output signal to shift from one of logic levels to the other logic level with the rising and falling timings of the pulse signal to be measured and initializing the count value of the counter, and causing the output signal to shift from the other logic level to one of logic levels when the count value of the counter reaches a predetermined value, the signal of the synchronous circuit being outputted as a pulse signal converted by the pulse converting circuit.

The time counting circuit may be used as an FM demodulating circuit. More specifically, the present invention provides an FM demodulating circuit for obtaining the frequency of an FM signal whose frequency is modulated, comprising an input signal converting circuit for converting an inputted FM signal to an FM pulse signal which is set to one of logic levels when the potential of the FM signal is higher than a reference potential, and is set to the other logic level when the potential of the FM signal is lower than the reference potential, an FM frequency divider for converting the FM pulse signal inputted from the input signal converting circuit to an FM divided-frequency pulse signal having either of rising and falling edges in accordance with the rising edge of the FM pulse signal and having either of the edges in accordance with the falling edge of the FM pulse signal, and a measuring circuit for measuring the time between either of the edges of the FM divided-frequency pulse signal outputted from the FM frequency divider, wherein the time obtained by the measuring circuit is the time taken from the rising edge to the falling edge of the FM pulse signal or the time taken from the falling edge to the rising edge thereof, and the inverse number of the time is obtained to find the frequency of the FM signal.

According to the FM demodulating circuit, the frequency of the FM signal is obtained every half period. Consequently, the FM signal can be demodulated with high accuracy.

DETAILED DESCRIPTION OF THE INVENTION

Preferred embodiments of the present invention will be described below with reference to the drawings.
First Embodiment For example, the case where a time counting circuit is used to measure the frequency of an FM signal will be described below according to the present embodiment.

Figure 1:
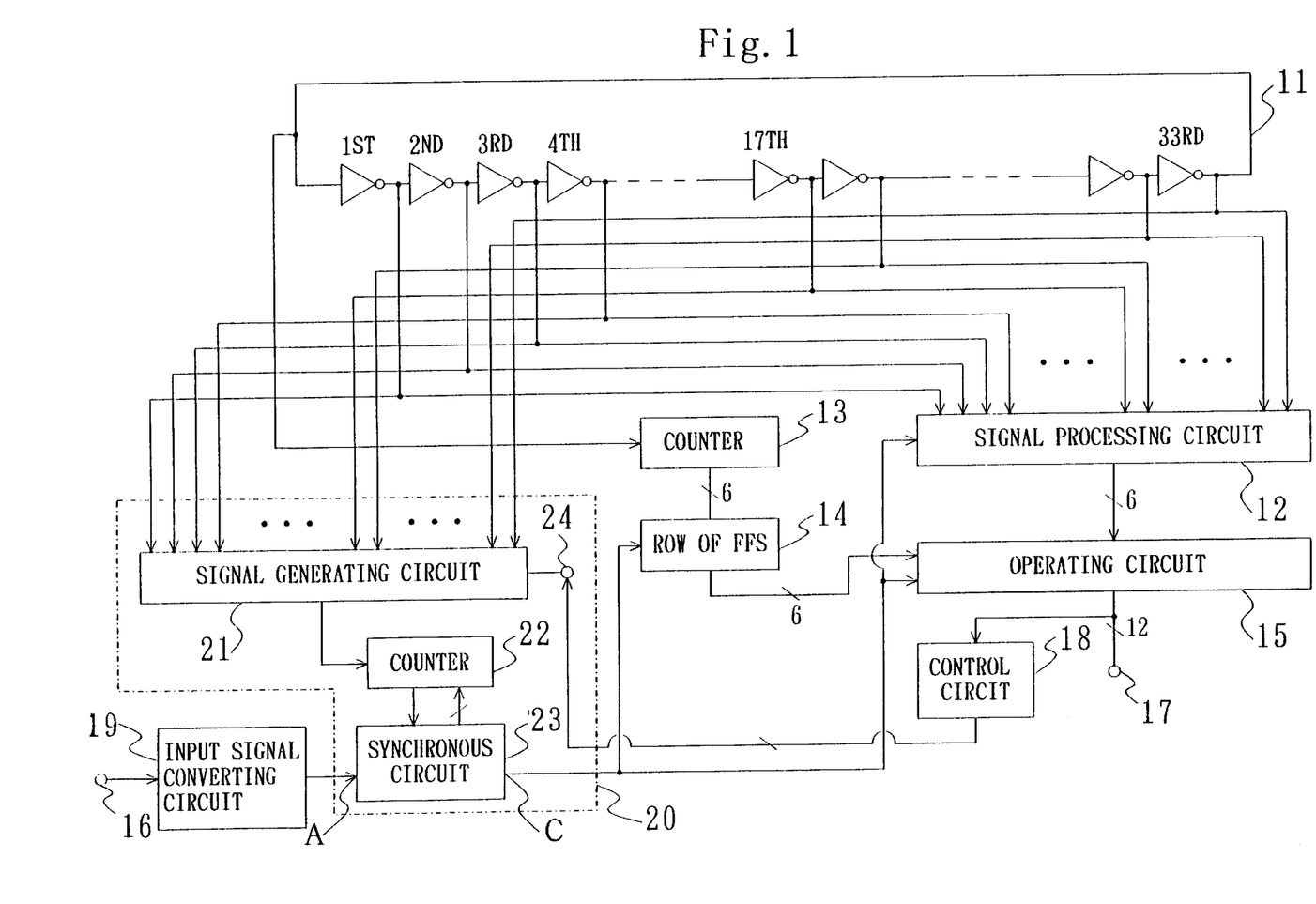
FIG. 1 is a block diagram showing the structure of a time counting circuit according to a first embodiment of the present invention.

FIG. 1 is a block diagram showing the structure of a time counting circuit according to a first embodiment of the present invention, in which are shown: an inverter ring 11 which acts as a delay circuit ring; a signal processing circuit 12; a counter 13; a row of flip-flops (FFs) 14; an operating circuit 15; a signal input terminal 16; a time data output terminal 17; a control circuit 18; and an input signal converting circuit 19. An FM frequency divider 20 which acts as a pulse converting circuit is composed of a signal generating circuit 21, a counter 22 and a synchronous circuit 23. A control signal is inputted from the control circuit 18 to a control terminal 24.

Figure 2:
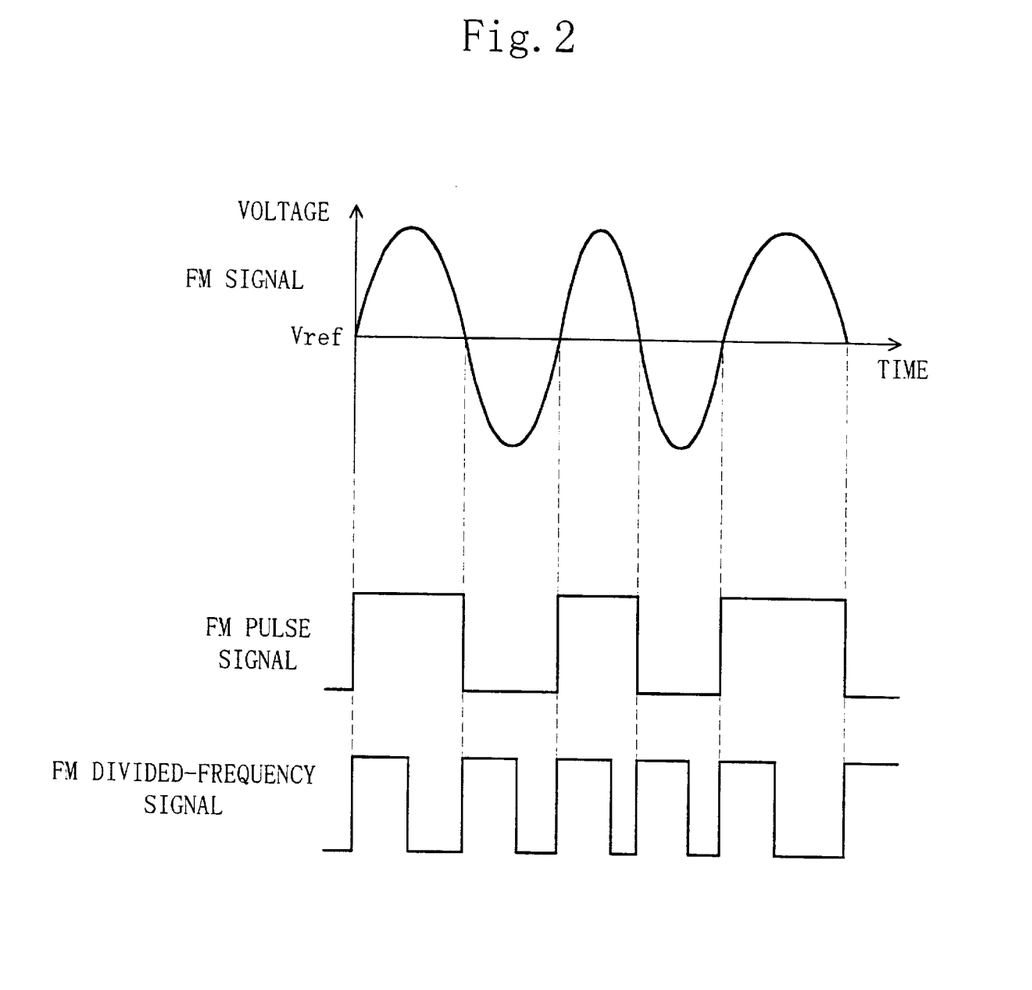
FIG. 2 is a graph which represents the relationship among an FM signal, an FM pulse signal and an FM divided-frequency pulse signal.

The signal input terminal 16 inputs an FM signal whose frequency is to be measured. The FM signal is converted to an FM pulse signal. If the magnitude of the FM signal is higher than a reference voltage, the FM pulse signal is set to the HIGH level. If the magnitude of the FM signal is lower than the reference voltage, the FM pulse signal is set to the LOW level. The FM frequency divider 20 inputs the FM pulse signal, and generates a pulse signal (hereinafter referred to as an FM divided-frequency pulse signal) to be outputted to the signal processing circuit 12, the row of FFs 14 and the operating circuit 15. The FM divided-frequency pulse signal rises when the FM pulse signal rises and falls. Time data which represents the pulse spacing of the FM divided-frequency pulse signal is outputted from the time data output terminal 17. FIG. 2 is a chart showing the relationship among the FM signal, the FM pulse signal and the FM divided-frequency pulse signal according to the present embodiment. In FIG. 2, Vref designates a reference voltage to be used when the FM signal is converted to the FM pulse signal.

A measuring circuit is composed of the inverter ring 11, the signal processing circuit 12, the counter 13, the row of FFs 14 and the operating circuit 15.

The inverter ring 11 consists of 33 ($2^5+1$) inverters having equal signal delay times, which are connected in a ring. The 1st to 33rd inverters are connected in series and the output terminal of the 33rd inverter is connected to the input terminal of the 1st inverter. Since an odd number of inverters are connected in a ring, the inverter ring 11 oscillates so that the signal transition is caused to circulate. A signal is outputted from each inverter composing the inverter ring 11 to the signal processing circuit 12. Consequently, the inverter ring 11 acts as a delay circuit ring in which each delay circuit is composed of one inverter.

The signal processing circuit 12 includes 33 flip-flops (FFs) as holding circuits, and a logic circuit. The input terminal of each FF composing the signal processing circuit 12 is connected to the output terminal of each inverter composing the inverter ring 11. The FM divided-frequency pulse signal outputted from the FM frequency divider 20 is inputted to the clock terminal of each FF. Consequently, the output signal of each inverter composing the inverter ring 11 is held in each FF when the FM divided-frequency pulse signal rises. The signal held in each FF is inputted to the logic circuit. The logic circuit performs operation based on the signal held in each FF and outputs 6-bit numeric data as the result of the operation.

The counter 13 counts the transition of the output signal of the 33rd inverter of the inverter ring 11. The count data is equal to the number of the circulations of the signal transition around the inverter ring 11. The row of FFs 14 inputs the count data of the counter 13, and inputs, at the clock terminal, the FM divided-frequency pulse signal outputted from the FM frequency divider 20. For this reason, the count data (6 bits) of the counter 13 is held and outputted when the FM divided-frequency pulse signal rises.

The operating circuit 15 calculates 12-bit time data which represents the pulse width of the FM divided-frequency pulse signal based on the 6-bit numeric data outputted from the signal processing circuit 12 and the 6-bit count data outputted from the row of FFs 14, and outputs the 12-bit time data.

The operation of a measuring circuit portion of the time counting circuit shown in FIG. 1 will be described below with reference to FIGS. 3 and 4.

Figure 3:
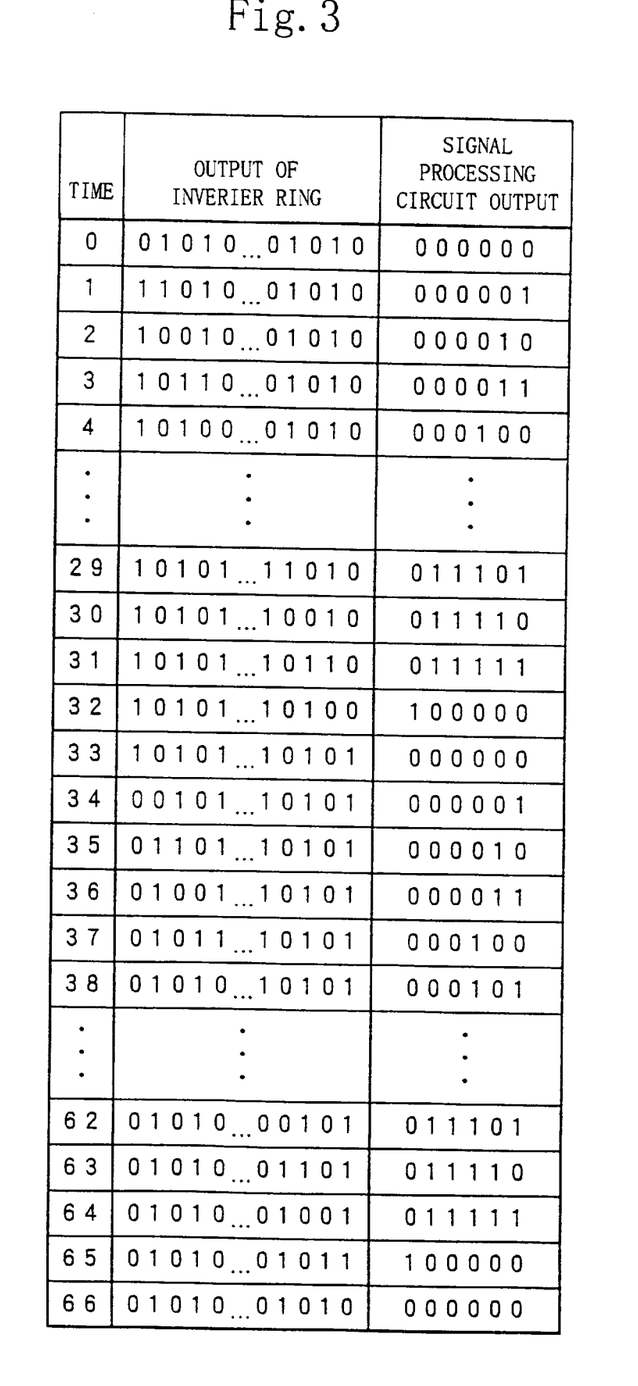
FIG. 3 is a chart showing the operation of a portion of a measuring circuit of the time counting circuit shown in FIG. 1, in which the output signal of an inverter ring and the output data of a signal processing circuit for each time are shown.

FIG. 3 shows the change of the output signal of the inverter ring 11 with the passage of time, and numeric data outputted from the signal processing circuit 12 when the FF divided-frequency pulse signal rises at each time. In FIG. 3, the HIGH and LOW levels represent "1" and "0" for the output signal of the inverter ring 11, respectively. An increment of time represents a signal delay time for one inverter, which is assumed to be 1 ns.

Here (time 0), it is assumed that the output voltages of all the odd-numbered inverters are on the LOW level and that the output voltages of all the even-numbered inverters are on the HIGH level. In this case, only the output voltages of the 33rd and 1st inverters are observed consecutively on the same level. When 1 ns elapses (time 1), the output voltage of the 1st inverter shifts from the LOW level to the HIGH level since the input voltage (that is, the output voltage of the 33rd inverter) is on the LOW level. The output voltages of the other odd-numbered inverters remain on the LOW level, while the output voltages of the even-numbered inverters remain on the HIGH level. In this case, only the output voltages of the 1st and 2nd inverters are observed consecutively on the same level.

When another 1 ns elapses (time 2), the output voltage of the 2nd inverter shifts from the HIGH level to the LOW level because the input voltage (that is, the output voltage of the 1st inverter) is on the HIGH level. The output voltages of the other even-numbered inverters and the output voltage of the 1st inverter remain on the HIGH level, while the output voltages of the odd-numbered inverters other than the 1st inverter remain on the LOW level. In this case, only the output voltages of the 2nd and 3rd inverters are observed consecutively on the same level. In this manner, the signal transition proceeds by one inverter every time 1 ns elapses.

When the FM divided-frequency pulse signal rises, each FF of the signal processing circuit 12 holds the output signal of each inverter composing the inverter ring 11 at the same time. In this case, the signal held in each FF becomes the same as the output signal of the inverter ring 11 shown in FIG. 3. The signal held in each FF is logically operated so that the signal processing circuit 12 outputs numeric data shown in the rightmost column of FIG. 3. For example, the numeric data outputted from the signal processing circuit 12 is ""000000" if the FM divided-frequency pulse signal rises at a time 0, and the numeric data is "000001" if the FM divided-frequency pulse signal rises at a time 1. Thus, 6-bit numeric data which represent 33 tones from "000000" to "100000" (hereinafter referred to as lower-bit data) are outputted from the signal processing circuit 12 based on the output signal of the inverter ring 11.

When the signal transition circulates around the inverter ring 11 (time 33), the output voltage of the 33rd inverter is changed from the LOW level to the HIGH level. Consequently, the counter 13 adds 1 to the count data. When the signal transition further circulates around the inverter ring 11 (time 66), the output voltage of the 33rd inverter is changed from the HIGH level to the LOW level. Consequently, the counter 13 further adds 1 to the count data. The row of FFs 14 holds the 6-bit count data outputted from the counter 13 and outputs the held 6-bit count data (hereinafter referred to as upper-bit data) when the FM divided-frequency pulse signal rises.

The lower-bit data outputted from the signal processing circuit 12 represents the current position of the signal transition on the inverter ring 11. The upper-bit data outputted from the row of FFs 14 represents the number of circulations of the signal transition. Accordingly, it is possible to obtain time data which represents the time for the rise of the FM divided-frequency pulse signal based on these two data.

However, the lower-bit data and the upper-bit data cannot be simply added to obtain 12-bit data. As is apparent from FIG. 3, the lower-bit data has values "000000" to "100000". For this reason, if the lower-bit data is simply added to the upper-bit data, the data becomes discontinuous between times 32 and 33, for example. In order to easily operate a time difference, the data should be continuous. For this reason, some correction is necessary. The correction is performed by the operating circuit 15.

Figure 4:
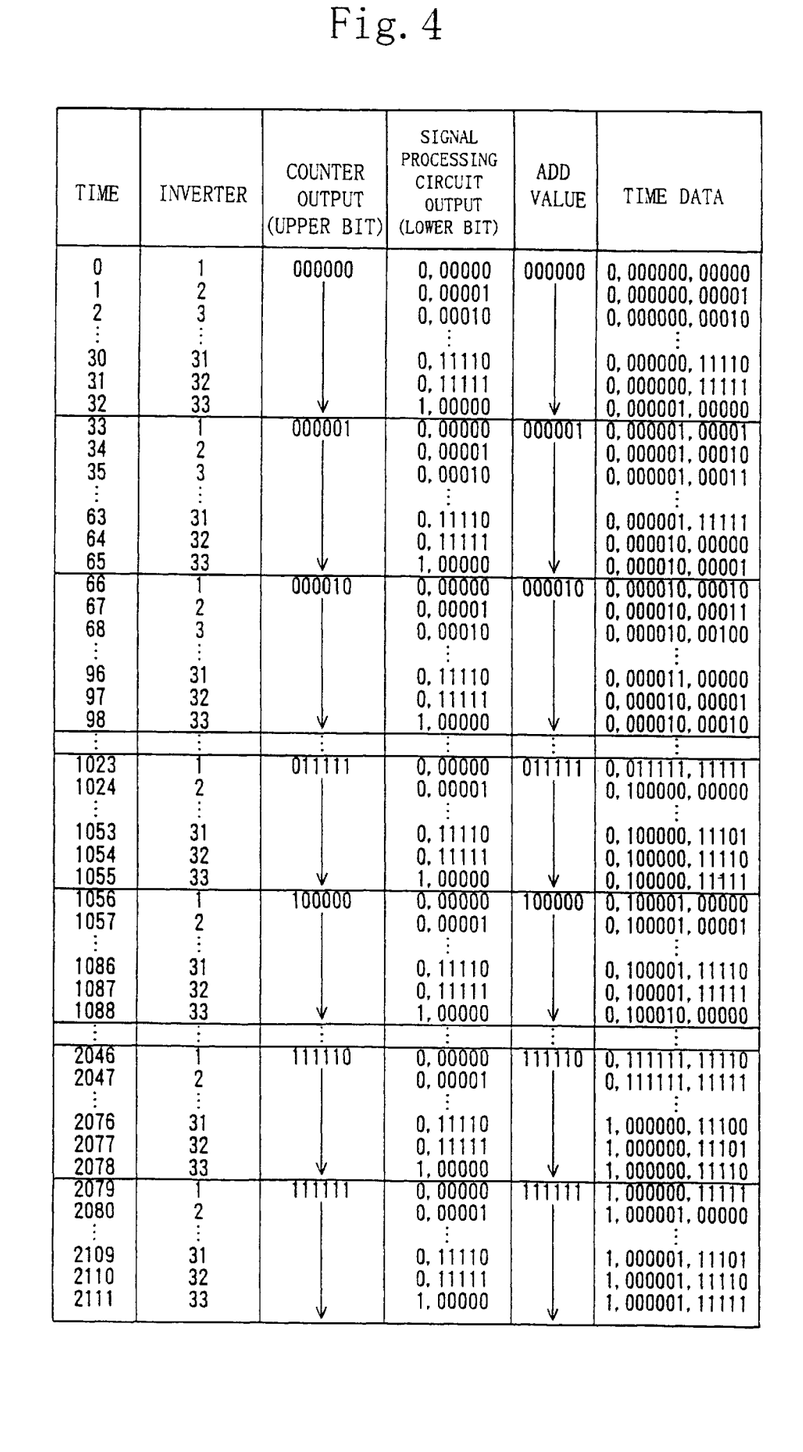
FIG. 4 is a chart showing the operation of the portion of the measuring circuit of the time counting circuit shown in FIG. 1, in which time data obtained by an operating circuit is shown.

FIG. 4 is a chart showing the time data obtained as a result of the data correction performed by the operating circuit 15. The detailed description of a data correcting method will be omitted (which has been disclosed in Japanese Patent Application No. 7-69805: "Time Counting Circuit and Counter Circuit"). It is apparent from FIG. 4 that continuous time data having 2112 (33 stages×$2^6$) tones are obtained by the time counting circuit shown in FIG. 1. By using the time data, the pulse spacing of the FM divided-frequency pulse signal can be measured.

The control circuit 18 outputs a control signal which controls the signal generating circuit 21 by logically operating the output data of the operating circuit 15.

The input signal converting circuit 19 converts, to an FM pulse signal, an FM signal whose frequency is to be measured that is inputted from the signal input terminal 16.

In the FM frequency divider 20, the signal generating circuit 21 selects some of the output signals of the inverters composing the inverter ring 11 in accordance with the control signal outputted from the control circuit 18, generates clock signals from the selected signals and outputs the clock signals. The counter 22 counts the number of clocks of the clock signal outputted from the signal generating circuit 21. The synchronous circuit 23 outputs, from a terminal C, an FM divided-frequency pulse signal which rises when the FM pulse signal inputted from a terminal A rises and falls and which falls when the count value of the counter 22 reaches a predetermined value after rising.

Figure 5:
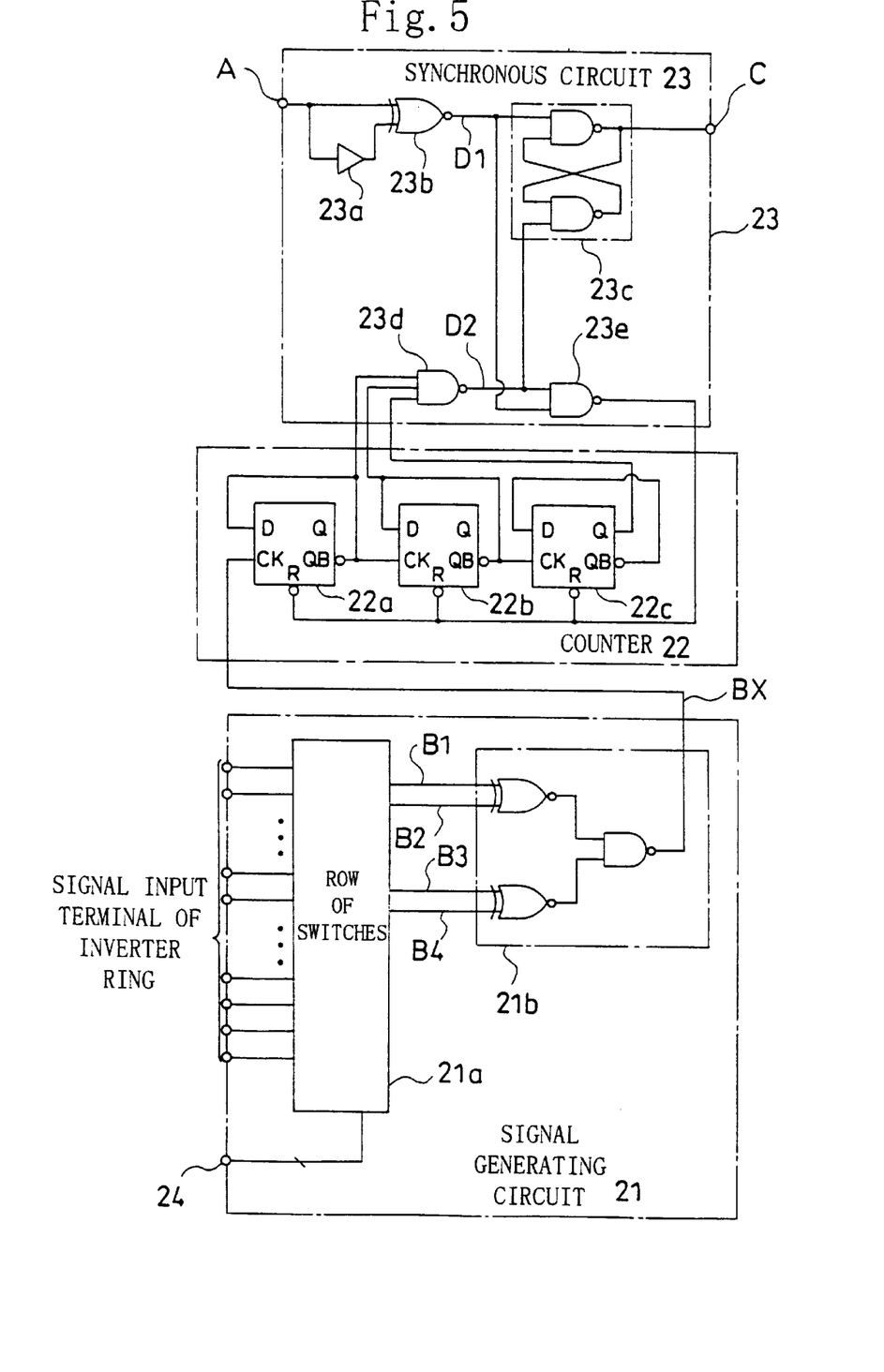
FIG. 5 is a diagram showing the structure of an FM frequency divider (a pulse converting circuit) in the time counting circuit shown in FIG. 1.

FIG. 5 is a circuit diagram showing the detailed structure of the FM frequency divider 20. In FIG. 5, the reference numeral 21 designates a signal generating circuit, the reference numeral 22 designates a counter and the reference numeral 23 designates a synchronous circuit which correspond to the structure shown in FIG. 1.

The signal generating circuit 21 is composed of a row of switches 21a and a logic circuit 21b, and generates a clock signal Bx to be sent to the counter 22. The row of switches 21a selects four signals B1, B2, B3 and B4 from the output signals of the inverter ring 11 in accordance with the control signal inputted from a control terminal 24. The logic circuit 21b takes the exclusive-OR of the signals B1 and B2 and that of the signals B3 and B4, and inverts the AND of signals which are obtained by inverting respective exclusive-OR signals to generate the clock signal Bx.

The counter 22 is an asynchronous counter for counting the number of clocks of the clock signal Bx outputted from the signal generating circuit 21, and is composed of a flip-flop (FF) 22a which acts as a first holding circuit, and FFs 22b and 22c which act as second holding circuits. In each FF, a terminal CK is a clock input terminal, a terminal D is a data input terminal, a terminal Q is a data output terminal, a terminal QB is a data inversion output terminal, and a terminal R is a reset terminal. When a signal having the LOW level is inputted to the terminal R, a signal outputted from the terminal Q is set to the LOW level irrespective of the value of the data inputted to the terminal D.

The synchronous circuit 23 is composed of a delay circuit 23a, an exclusive-OR inverting circuit 23b, a RS flip-flop 23c, a 3-input NAND gate 23d and a 2-input NAND gate 23e, and serves to convert the FM pulse signal inputted from the terminal A to the FM divided-frequency pulse signal to be outputted from the terminal C. The delay circuit 23a and the exclusive-OR inverting circuit 23b compose a first logic circuit. The RS flip-flop 23c and the 3-input NAND gate 23d compose a second logic circuit. The 2-input NAND gate 23e composes a third logic circuit.

Figure 6:
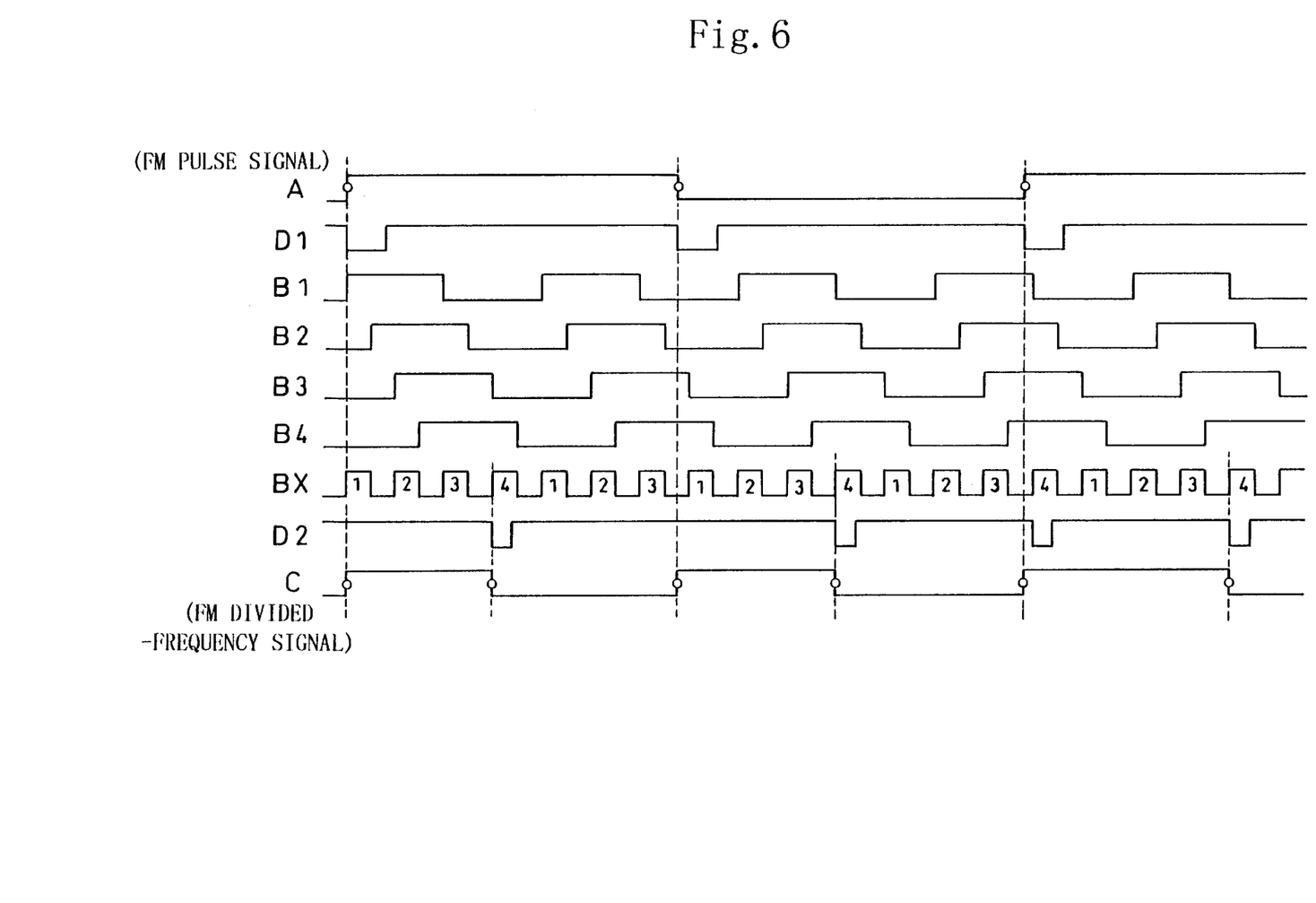
FIG. 6 is a timing chart showing the operation of the FM frequency divider (pulse converting circuit) shown in FIG. 5.

The operation of the FM frequency divider 20 shown in FIG. 5 will be described below. FIG. 6 is a timing chart showing the operation of the FM frequency divider 20 shown in FIG. 5. In FIG. 6, A designates an FM pulse signal inputted to the terminal A of the synchronous circuit 23, D1 is an output signal of the exclusive-OR inverting circuit 23b composing the synchronous circuit 23, B1, B2, B3 and B4 designate output signals of the row of switches 21a composing the signal generating circuit 21, Bx designates a clock signal outputted from the signal generating circuit 21 to the counter 22, D2 designates an output signal of the 3-input NAND gate 23d composing the synchronous circuit 23, and C designates an FM divided-frequency pulse signal outputted from the terminal C of the synchronous circuit 23. In each clock of the clock signal Bx, the count value of the counter 22 is written.

Herein, the output signal of the 1st inverter is selected as the signal B1, by the row of switches 21a, from the output signals of the inverters composing the inverter ring 11, the output signal of the 9th inverter is selected as the signal B2, the output signal of the 17th inverter is selected as the signal B3, and the output signal of the 25th inverter is selected as the signal B4. If a signal delay time of each inverter of the inverter ring 11 is 1 ns, a time difference between the signals B1 and B2 is 8 ns. In the same manner, time differences between the signals B2 and B3 and between the signals B3 and B4 are also 8 ns. For this reason, the signals B1 to B4 are logically operated by the logic circuit 21b so that the clock signal Bx having a period of 16 (=8×2) ns is generated. Strictly, the period of the clock signal Bx is not constant. The reason is that a time difference between the fall of the signal B4 and the rise of the signal B1 is 9 ns so that the spacing of clocks of the clock signal Bx is 9 ns in some cases. However, this results in the delay of the falling timing of the FM divided-frequency pulse signal and does not influence the measurement of the time between the rising edges.

The exclusive-OR of the FM pulse signal and the signal which is delayed by a predetermined time by the delay circuit 23a is obtained and the FM pulse signal is then inverted into the signal D1 which is set to the LOW level only during the delay time of the delay circuit 23a from the rise and fall of the FM pulse signal.

When the signal D1 is set to the LOW level, the output signal of the RS flip-flop 23c (that is, the FM divided-frequency pulse signal outputted from the terminal C) is changed to be on the HIGH level. Accordingly, the FM divided-frequency pulse signal rises synchronously with the rising or falling timing of the FM pulse signal.

When four rising edges of the clock signal Bx enter the counter 22, the counter 22 outputs binary data "100" which corresponds to a decimal number of "4". In this case, the signal of the inversion output terminal QB of the leftmost flip-flop 22a corresponding to a least significant bit, the signal of the inversion output terminal QB of the central flip-flop 22b corresponding to a second bit, and the signal of the output terminal Q of the rightmost flip-flop 22c corresponding to a most significant bit are set to the HIGH level. Consequently, the output signal D2 of the NAND gate 23d composing the synchronous circuit 23 is changed to be on the LOW level.

When either of the signals D1 and D2 is on the LOW level, the output of the NAND gate 23e is set to the HIGH level so that the count value of the counter 22 is reset.

When the signal D2 is on the LOW level, the output signal of the RS flip-flop 23c (that is, the FM divided-frequency pulse signal outputted from the terminal C) is changed to be on the LOW level. Accordingly, when the rise of the clock signal Bx is counted by 4 after the counter 22 is reset, the FM divided-frequency pulse signal falls.

Consequently, the FM divided-frequency pulse signal which always rises according to the rise and fall of the FN pulse signal is obtained. By measuring the pulse spacing from the rise to the next rise of the FM divided-frequency pulse signal, the time taken from the rise to the fall of the FM pulse signal and the time taken from the fall to the rise thereof can be measured.

The time for which the FM divided-frequency pulse signal is on the HIGH level is almost equivalent to the time before "100" (a decimal number of 4) is counted after the counter 22 is reset. Since the period of the clock signal Bx is 16 ns, the FM divided-frequency pulse signal is set to the HIGH level for about 64 (=16×4) ns.

The time for which the FM divided-frequency pulse signal is on the HIGH level can optionally be varied every 16 ns by changing the setting of the counter 22. For example, if the signal of the output terminal Q of the flip-flop 22a corresponding to a least significant bit is inputted to the NAND gate 23d in place of the inversion output terminal QB, the count value of the counter 22 is set to "101". Consequently, the time for which the FM divided-frequency pulse signal is on the HIGH level is increased by 16 ns.

Furthermore, the time for which the FM divided-frequency pulse signal is on the HIGH level can be varied by changing the period of the clock signal Bx. For example, the output signals of the 1st, 5th, 9th, 13th, 17th, 21st, 25th and 29th inverters of the delay circuit ring 11 are selected by the row of switches 21a of the signal generating circuit 21, respectively. Based on these signals, the clock signal Bx having a period of 8 ns can be outputted to the counter 22. In this case, the time for which the FM divided-frequency pulse signal is on the "HIGH" level can be varied every 8 ns by the setting of the counter 22. If the delay time of each inverter composing the inverter ring 11 is 1 ns, the time for which the FM divided-frequency pulse signal is on the HIGH level can be varied every minimum 2 ns.

The control circuit 18 can output a control signal to the signal generating circuit 21 based on time data outputted from the operating circuit 15 to control the time for which the FM divided-frequency pulse signal is on the HIGH level. Consequently, the control circuit 18 can also correspond to an FM pulse signal having a great modulation frequency band.

However, there is a possibility that the time for which the FM divided-frequency pulse signal is on the HIGH level is not sufficiently long depending on the rising or falling timing of the FM pulse signal and the falling timing of the signal D2. For example, it is assumed that the signal D2 is set to the LOW level immediately after the signal D1 is set to the LOW level by the rise or fall of the FM pulse signal. In this case, if the signal D2 remains on the LOW level after the signal D1 is set to the HIGH level, the FM divided-frequency pulse signal outputted from the RS flip-flop circuit 23c is set to the LOW level. Consequently, the period for which the FM divided-frequency pulse signal is on the HIGH level is not sufficiently long.

In order to prevent this phenomenon, the synchronous circuit 23 is designed such that the LOW level period of the signal D2 is completed within the LOW level period of the signal D1 even though the rise or fall of the FM pulse signal overlaps with the fall of the signal D2. While the LOW level period of the signal D1 is decided by the delay time of the delay circuit 23a, the LOW level period of the signal D2 is decided by the time necessary to reset the counter 22. Accordingly, the delay time of the delay circuit 23a is much longer than the time necessary to reset the counter 22.

The counter 22 can have a structure in which the count set value of the clock signal Bx is variable by blocking the FFs, for example. In this case, the counter 22 may have a structure in which the count value can be artificially set externally or a structure in which the count value is set in accordance with the control signal sent from the control circuit 18.

There will be described the setting of the period of the clock signal Bx and the count value of the counter 22 which is performed in the case where the present invention is applied to an actual apparatus.

Examples of an object to which the present invention is applied include a LD (laser disk), a DVD (digital video disk), a set top box and the like. The FM signal of the LD has a frequency of 3.5 to 15 MHz and that of the DVD has a frequency of 22 to 33 MHz. Accordingly, the time between the edges of the FM pulse signal is always varied in accordance with the frequency. In the LD, the shortest time is about 33.3 ns. In the DVD, the shortest time is about 15.15 ns.

The time for which the FM divided-frequency pulse signal is on the HIGH level should be shorter than the time between the edges of the FM pulse signal. In order to cause a measuring circuit portion of the time counting circuit to operate normally, the time for which the FM divided-frequency pulse signal is on the HIGH level should be about 3 to 5 ns or more. Accordingly, the time for which the FM divided-frequency pulse signal is on the HIGH level should be set to about 10 ns, for example.

If each stage of the inverters composing the inverter ring 11 has a delay time of 0.35 ns, the period of the clock signal Bx can be varied from 0.7 (=0.35×2) ns to 23.1 (=0.35×33×2) ns by the signal generating circuit 21. Assuming that the counter 22 can be set up to "8" as a count value, the time for which the FM divided-frequency pulse signal is on the HIGH level can be set to 184.8 (=23.1×8) ns at the maximum. Accordingly, in the case where the present invention is applied to the LD or the DVD, the time for which the FM divided-frequency pulse signal is on the HIGH level can be set to a suitable value.

While the measuring circuit has the function of measuring the time between the rising edges of the pulse signal and the FM divided-frequency pulse signal always rises in accordance with the rise and fall of the FM pulse signal in the present embodiment, the present invention is not restricted thereto. The measuring circuit may have the function of measuring the time between the falling edges of the pulse signal and the FM divided-frequency pulse signal may always fall in accordance with the rise and fall of the FM pulse signal.

Figure 7:
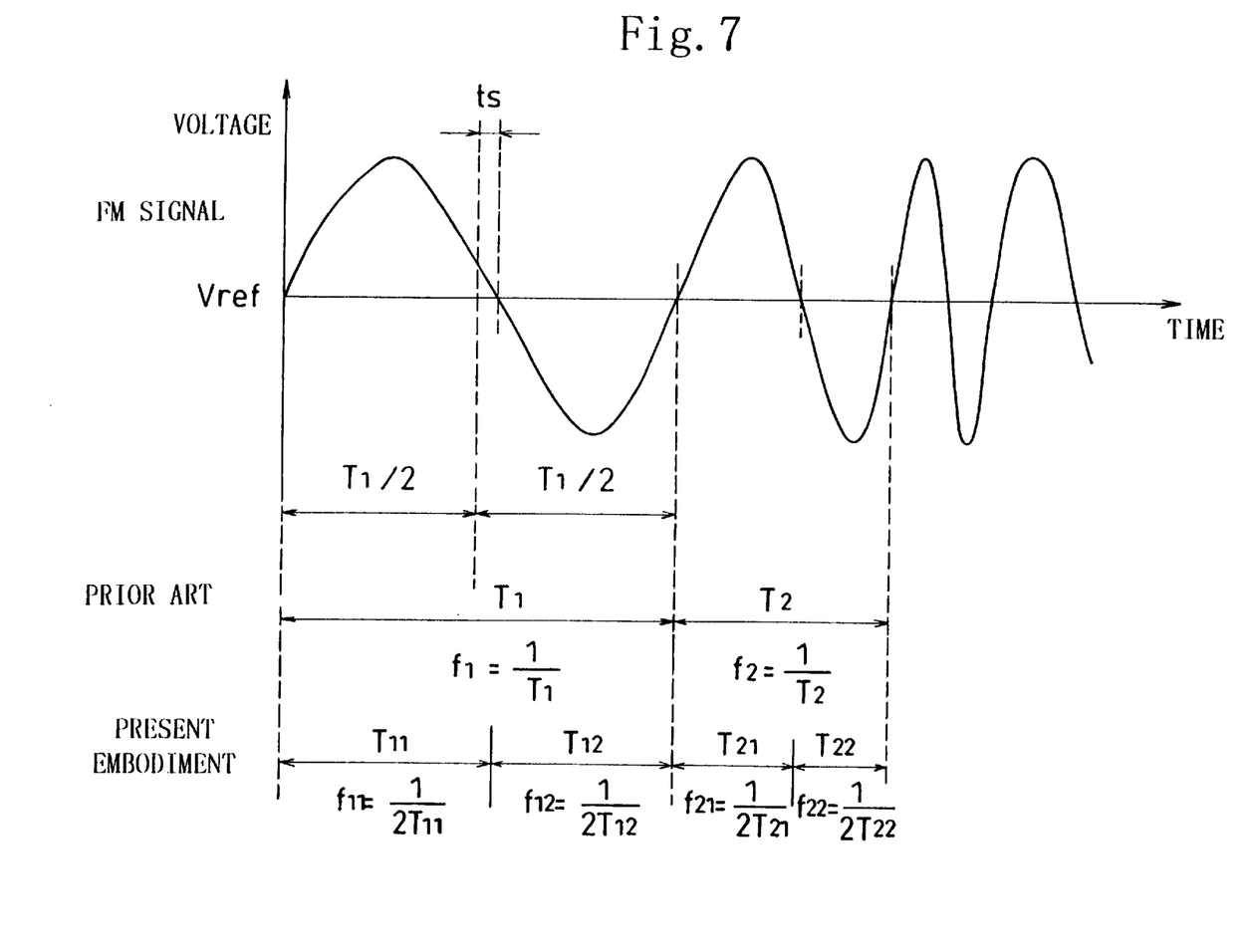
FIG. 7 is a chart for explaining the effects obtained in the case where the time counting circuit according to the first embodiment of the present invention is used for FM demodulation.

FIG. 7 is a chart for explaining the effects obtained in the case where the FM signal is demodulated according to the present embodiment. As shown in FIG. 7, the FM signal is converted to a pulse signal, the pulse spacing of the pulse signal is measured by using the conventional time counting circuit (T1 and T2), and an inverse number thereof is obtained to find the frequency (f1 and f2) of the FM signal. Consequently, the frequency can be obtained only every period. Actually, the frequency of the FM signal also changes within one period. For example, a measuring error of a time difference ts is made every half period. On the other hand, the FM divided-frequency pulse signal which rises every time the FM signal intersects with a reference voltage (Vref) axis is generated by the FM frequency divider 20, the pulse spacing of the FM divided-frequency pulse signal is measured (T11, T12, T21 and T22), and an inverse number thereof is obtained to find the frequency (f11, f12, f21 and f22) of the FM signal according to the present embodiment. Consequently, the frequency can be obtained every half period so that demodulation accuracy can be enhanced.

Second Embodiment

According to the first embodiment, the pulse signal (FM pulse signal) to be measured is converted to the pulse signal (FM divided-frequency pulse signal) having either the rising edge or the falling edge in accordance with the rising and falling edges of the pulse signal to be measured, and the time for either of the edges of the converted pulse signal is measured to measure the time taken from the rising edge to the falling edge of the pulse signal to be measured and from the falling edge to the rising edge thereof.

On the other hand, the times taken from the rising edge to the falling edge of the pulse signal to be measured and from the falling edge to the rising edge thereof are measured by holding the signal of a delay circuit ring with the timings of the rising and falling edges of the pulse signal to be measured in the present embodiment.

Also in the present embodiment, the case where a time counting circuit is used to measure the frequency of the FM signal will be described as an example.

Figure 8:
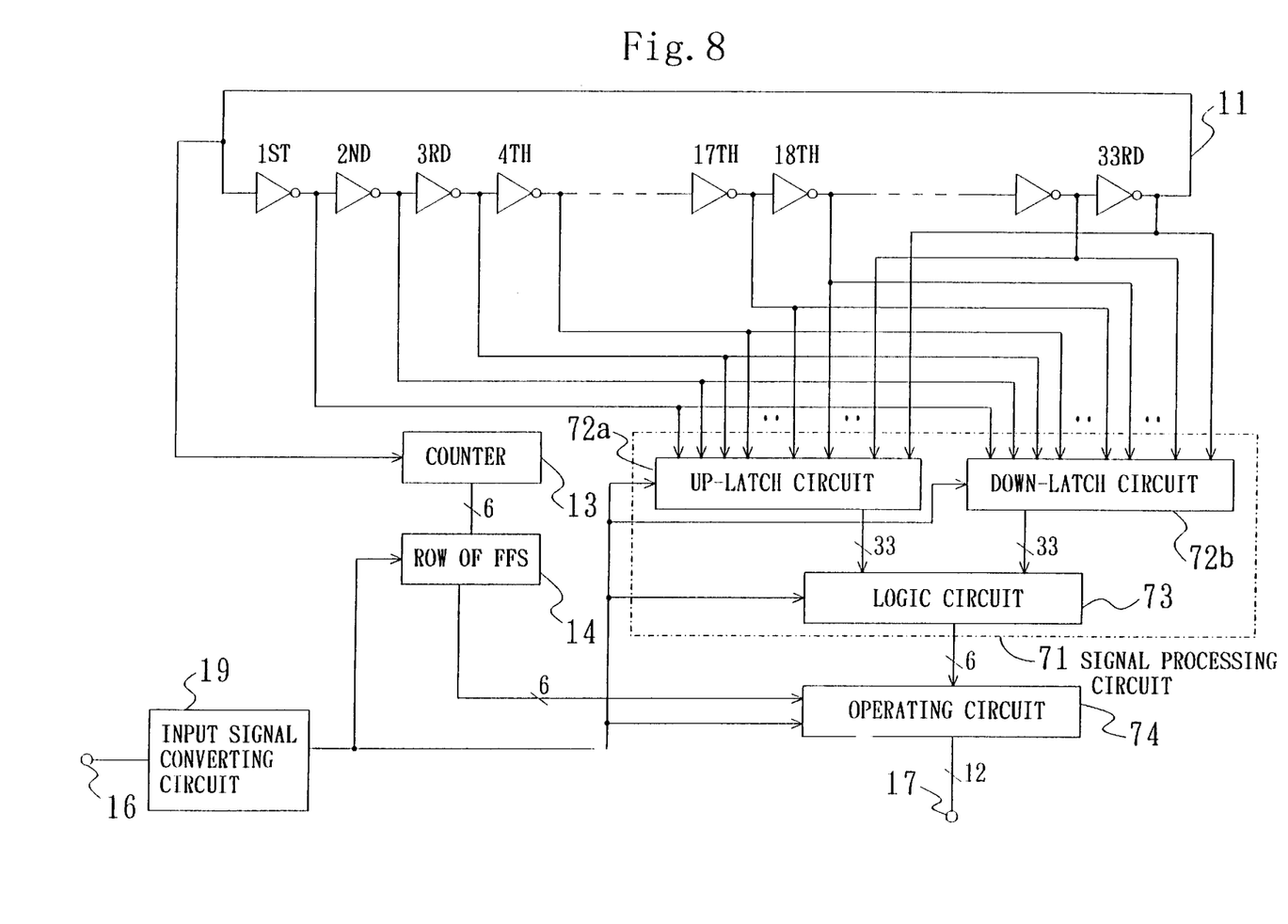
FIG. 8 is a block diagram showing the structure of a time counting circuit according to a second embodiment of the present invention.

FIG. 8 is a block diagram showing the structure of the time counting circuit according to a second embodiment of the present invention. In FIG. 8, the same components as in the time counting circuit according to the first embodiment shown in FIG. 1 have the same reference numerals as in FIG. 1 and the detailed description will be omitted.

The reference numeral 72a designates an up-latch circuit which acts as first holding means for holding the oscillation output signals of an inverter ring 11 that acts as a delay circuit ring with the timing of the rising edge of an input signal, the reference numeral 72b designates a down-latch circuit which acts as second holding means for holding the oscillation output signal of the inverter ring 11 with the timing of the falling edge of the input signal, and the reference numeral 73 designates a logic circuit for converting the signals held in the up-latch circuit 72a and the down-latch circuit 72b to numeric data to be outputted. The up-latch circuit 72a, the down-latch circuit 72b and the logic circuit 73 compose a signal processing circuit 71. The reference numeral 74 designates an operating circuit for operating time data. For example, the up-latch circuit 72a is composed of a plurality of flip-flops which have input terminals connected to the output terminals of inverters composing the inverter ring 11 and hold an input signal with the timing of the rising edge of a clock signal. In this case, the FM pulse signal is sent as a clock signal to each flip-flop. Similarly, the down-latch circuit 72b is composed of a plurality of flip-flops which have input terminals connected to the output terminals of the inverters composing the inverter ring 11 and hold an input signal with the timing of the falling edge of a clock signal, for example.

As shown in FIG. 8, the time counting circuit according to the present embodiment does not include a pulse converting circuit which is provided on the time counting circuit according to the first embodiment. An FM signal inputted to a signal input terminal 16 is converted to an FM pulse signal by an input signal converting circuit 19. The FM pulse signal is inputted to the up-latch circuit 72a, the down-latch circuit 72b, the logic circuit 73, a row of FFs 14, and the operating circuit 74.

Figure 9:
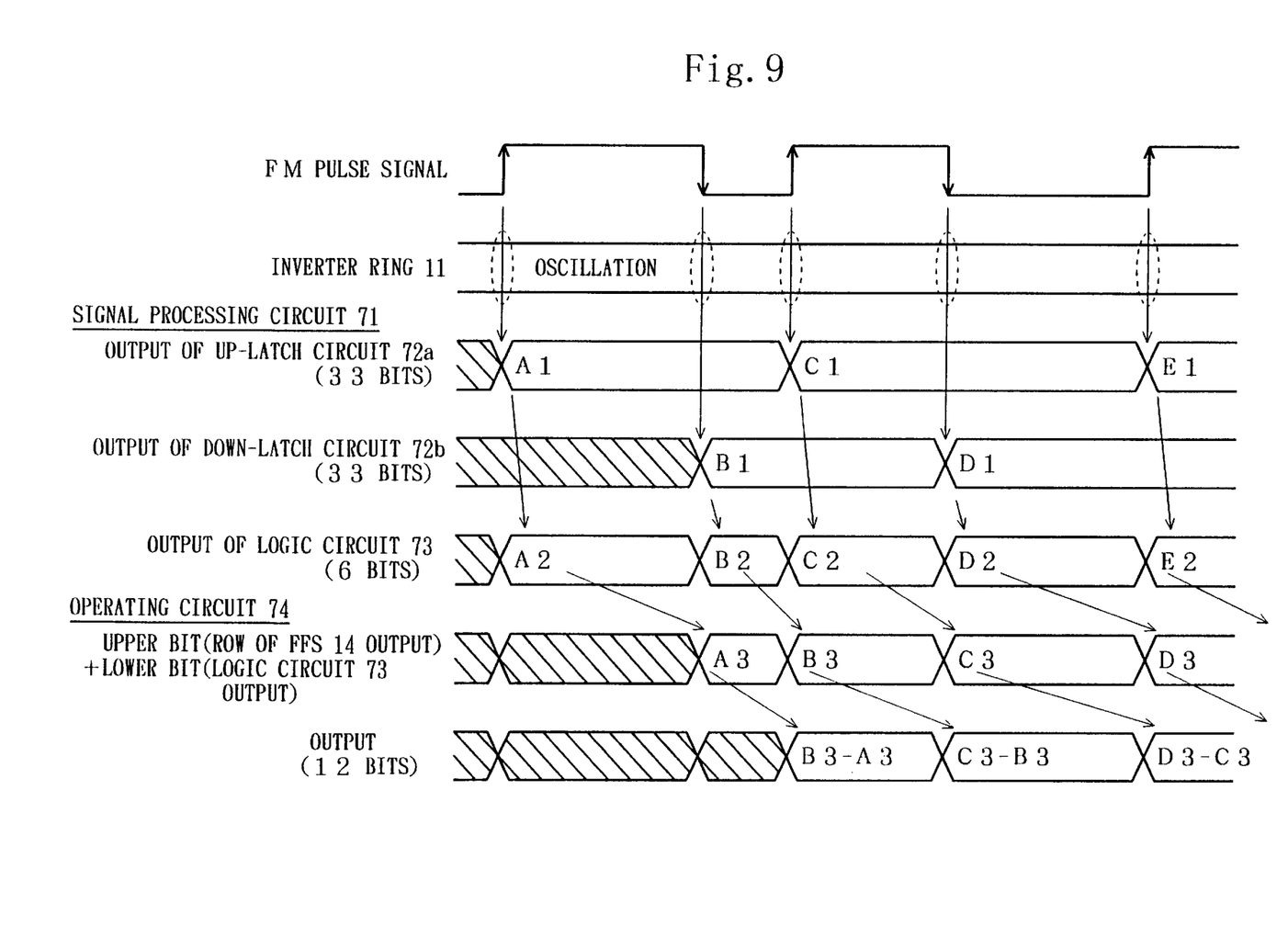
FIG. 9 is a timing chart showing the operation of the time counting circuit shown in FIG. 8.

FIG. 9 is a timing chart showing the operation of the timing counting circuit according to the present embodiment shown in FIG. 8. The operation of the time counting circuit according to the present embodiment will be described below with reference to FIG. 9.

The inverter ring 11 is composed of an odd number of (33 in FIG. 8) inverters which are connected in a ring. Therefore, the inverter ring 11 oscillates so that the signal transition circulates. The up-latch circuit 72a holds the output signal of each inverter of the inverter ring 11 with the timing of the rising edge of the FM pulse signal, and sends the output signal as 33-bit data to the logic circuit 73 (A1, C1, E1). The down-latch circuit 72b holds the output signal of each inverter of the inverter ring 11 with the timing of the falling edge of the FM pulse signal, and sends the output signal as 33-bit data to the logic circuit 73 (B1, D1). More specifically, the up-latch circuit 72a and the down-latch circuit 72b alternately output data synchronously with the rising and falling edges of the FM pulse signal.

The logic circuit 73 operates synchronously with both rising and falling edges of the FM pulse signal, encodes 33-bit data outputted from the up-latch circuit 72a and the down-latch circuit 72b into 6-bit data, and outputs the 6-bit data to the operating circuit 74 in order of output from the up-latch circuit 72a and the down-latch circuit 72b (A2, B2, C2, D2, E2).

The operating circuit 74 also operates synchronously with both rising and falling edges of the FM pulse signal, obtains data which represents the timings of the rising and falling edges of the FM pulse signal by setting the data outputted from the logic circuit 73 as lower bits (A3, B3, C3, D3), and makes the difference between these data to obtain and output time data which represent the time taken from the rising edge to the falling edge and the time taken from the falling edge to the rising edge (B3–A3, C3–B3, C3–D3).

While the time counting circuit using the inverter ring, as a delay circuit ring, in which each delay circuit is composed of one inverter has been described as an example in the first and second embodiments, the present invention is not restricted to such a structure but can be applied to a time counting circuit using a delay circuit ring having any structure.

In the first and second embodiments, the oscillation frequency of the delay circuit ring may be stabilized by a PLL circuit. For example, a phase comparator and a loop filter are provided, the output signal of one of the delay circuits composing the delay circuit ring is compared with a reference clock signal having an accurate frequency by the phase comparator, the output signal of the phase comparator is changed into a DC current by the loop filter, and the DC current is then supplied to each delay circuit composing the delay circuit ring. By such a structure, the delay time for each delay circuit is regulated until the frequency of the output signal of one of the delay circuits becomes equal to that of the reference clock signal. Consequently, the oscillation frequency of the delay circuit ring is stabilized.

We claim:

1. A pulse converting circuit for converting an inputted pulse signal to a divided-frequency pulse signal having either of rising and falling edges in accordance with both the rising and falling edges of said inputted pulse signal, comprising:

a signal generating circuit for generating a clock signal;

a counter for counting the clock signal outputted from said signal generating circuit; and a synchronous circuit for receiving said inputted pulse signal, causing an output signal to shift from one of logic levels to the other logic level and initializing the count value of said counter with the rising and falling timings of said inputted pulse signal, and causing said output signal to shift from said other logic level to said one of logic levels when the count value of said counter reaches a predetermined value, the output signal of said synchronous circuit being outputted as said divided-frequency pulse signal.

2. The pulse converting circuit according to claim 1, wherein said signal generating circuit has the function of setting and changing the period of the generated clock signal.

3. The pulse converting circuit according to claim 1, having the function of setting and changing the predetermined count value of said counter obtained when said synchronous circuit causes the output signal to shift from the other logic level to said one of logic levels.

4. An FM demodulating circuit for obtaining the frequency of an FM signal whose frequency is modulated, comprising:

an input signal converting circuit for converting an inputted FM signal to an FM pulse signal which is set to one of logic levels when the potential of the FM signal is higher than a reference potential, and is set to the other logic level when the potential of the FM signal is lower than said reference potential;

an FM frequency divider for converting the FM pulse signal inputted from said input signal converting circuit to an FM divided-frequency pulse signal having either of rising and falling edges in accordance with both the rising and falling edges of the FM pulse signal; and a measuring circuit for measuring the time between said either of edges of the FM divided-frequency pulse signal outputted from said FM frequency divider, wherein the time obtained by said measuring circuit is the time taken from the rising edge to the falling edge of said FM pulse signal or the time taken from the falling edge to the rising edge thereof, and the inverse number of the time is obtained to find the frequency of said FM signal.

* * * * *